US012086441B2

(12) United States Patent
Miller et al.

(10) Patent No.: US 12,086,441 B2
(45) Date of Patent: Sep. 10, 2024

(54) BLOCK COPY

(71) Applicant: Rambus Inc., San Jose, CA (US)

(72) Inventors: Michael Raymond Miller, Raleigh, NC (US); Steven C. Woo, Saratoga, CA (US); Thomas Vogelsang, Mountain View, CA (US)

(73) Assignee: Rambus Inc., San Jose, CA (US)

( * ) Notice: Subject to any disclaimer, the term of this patent is extended or adjusted under 35 U.S.C. 154(b) by 124 days.

(21) Appl. No.: 17/461,105

(22) Filed: Aug. 30, 2021

(65) Prior Publication Data

US 2022/0083224 A1 Mar. 17, 2022

Related U.S. Application Data

(60) Provisional application No. 63/077,153, filed on Sep. 11, 2020.

(51) Int. Cl.
*G06F 3/06* (2006.01)
*G06F 1/08* (2006.01)

(52) U.S. Cl.
CPC .............. *G06F 3/064* (2013.01); *G06F 1/08* (2013.01); *G06F 3/0604* (2013.01);
(Continued)

(58) Field of Classification Search
CPC .......... G06F 3/064; G06F 1/08; G06F 3/0604; G06F 3/0631; G06F 3/0659; G06F 3/0688; G06F 15/76; G11C 11/4072; G11C 5/066; G11C 5/025; G11C 11/401; G11C 11/4076; G11C 11/409; G11C 11/4096
See application file for complete search history.

(56) References Cited

U.S. PATENT DOCUMENTS

2006/0129701 A1* 6/2006 Qawami ................ G11C 5/066
710/4
2015/0016172 A1* 1/2015 Loh ........................ G06F 3/0608
365/51

(Continued)

FOREIGN PATENT DOCUMENTS

CN 109599136 A * 4/2019 ......... G06F 12/0284

OTHER PUBLICATIONS

Rezaei, Seyyed Hossein Seyyedahaei et al., "NoM: Network-on-Memory for Inter-Bank Data Transfer in Highly-Banked Memories", IEEE Computer Architecture Letters, vol. 19, No. 1, Jan.-Jun. 2020, pp. 80-83. 4 pages.

*Primary Examiner* — Masud K Khan
(74) *Attorney, Agent, or Firm* — The Neudeck Law Firm, LLC

(57) ABSTRACT

An interconnected stack of one or more Dynamic Random Access Memory (DRAM) die also has one or more custom logic, controller, or processor die. The custom die(s) of the stack include direct channel interfaces that allow direct access to memory regions on one or more DRAMs in the stack. The direct channels are time-division multiplexed such that each DRAM die is associated with a time slot on a direct channel. The custom die configures a first DRAM die to read a block of data and transmit it via the direct channel using a time slot that is assigned to a second DRAM die. The custom die also configures the second memory device to receive the first block of data in its assigned time slot and write the block of data.

20 Claims, 18 Drawing Sheets

(52) U.S. Cl.
CPC ......... *G06F 3/0631* (2013.01); *G06F 3/0659* (2013.01); *G06F 3/0688* (2013.01)

(56) References Cited

U.S. PATENT DOCUMENTS

| | | | |
|---|---|---|---|
| 2015/0041971 A1* | 2/2015 | Lee | G11C 5/063 257/737 |
| 2019/0205244 A1* | 7/2019 | Smith | G06F 3/065 |
| 2021/0263671 A1* | 8/2021 | O | G06F 3/0655 |

* cited by examiner

| CORE CYCLE | X | | | | Y | | | | Z | | | | ... | XX | | | |
|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | ... | XX0 | XX1 | XX2 | XX3 |
| CTRL CA | RD A | WR B | | RD C | | WR D | RD E | RD F | WR G | | | | ... | | | | |
| CTRL DQ | | DRV D[B] | | | SAM D[A] | DRV D[D] | | SAM D[C] | DRV D[G] | | SAM D[E] | SAM D[F] | ... | | | | |
| DIE0 DQ | | | | | DRV D[A] | | | | SAM D[G] | | | | ... | | | | |
| DIE1 DQ | | SAM D[B] | | | | SAM D[D] | | | | | | | ... | | | | |
| DIE2 DQ | | | | | | | | DRV D[C] | | | DRV D[E] | | ... | | | | |
| DIE3 DQ | | | | | | | | | | | | DRV D[F] | ... | | | | |

*FIG. 3A*

| CORE CYCLE | X | | | | Y | | | | Z | | | | ... | XX | | | |
|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | ... | XX0 | XX1 | XX2 | XX3 |
| CTRL CA | RD A | WR B | | RD C | | WR D | RD E | RD F | WR G | | | | ... | | | | |
| CTRL DQ | | DRV D[B] | | | SAM D[A] | DRV D[D] | | SAM D[C] | DRV D[G] | | | SAM D[F] | ... | | | | |
| DIE0 DQ | | | | | DRV D[A] | | | | SAM D[G] | | | | ... | | | | |
| DIE1 DQ | | SAM D[B] | | | | SAM D[D] | | | | | | | ... | | | | |
| DIE2 DQ | | | | | | | | DRV D[C] | | | DRV D[E] | | ... | | | | |
| DIE3 DQ | | | | | | | | | | | | DRV D[F] | ... | | | | |

*FIG. 3B*

| CORE CYCLE | X | | | | Y | | | | Z | | | | ... | XX | | | |
|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | ... | XX0 | XX1 | XX2 | XX3 |
| CTRL CA | RD A | WR B | | RD C | | WR D | RD E | RD F | WR G | | | | ... | | | | |
| CTRL DQ | | DRV D[B] ←353 | | | SAM D[A] | DRV D[D] | | SAM D[C] | DRV D[G] | | SAM D[E] | SAM D[F] | ... | | | | |
| DIE0 DQ | | | | | DRV D[A] | | | | SAM D[G] | | | | ... | | | | |
| DIE1 DQ | | SAM D[B] ←354 | | | | SAM D[D] | | | | | | | ... | | | | |
| DIE2 DQ | | | | | | | | DRV D[C] | | | DRV D[E] | | ... | | | | |
| DIE3 DQ | | | | | | | | | | | | DRV D[F] | ... | | | | |

*FIG. 3C*

| CORE CYCLE | X | | | | Y | | | | Z | | | | ... | XX | | | |
|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | ... | XX0 | XX1 | XX2 | XX3 |
| CTRL CA | RBC A 1 N | | | | | WBC B N | | | | | | | ... | | | | |
| CTRL DQ | | | | | | | | | | | | | ... | | | | |
| DIE0 DQ | | | | | | DRV D[A] | | | | DRV D[A+1] | | | ... | | DRV D[A*] | | |
| DIE1 DQ | | | | | | SAM D[B] | | | | SAM D[B+1] | | | ... | | SAM D[B*] | | |
| DIE2 DQ | | | | | | | | | | | | | ... | | | | |
| DIE3 DQ | | | | | | | | | | | | | ... | | | | |

| CORE CYCLE | | X | | | | Y | | | | Z | | | | ... | XX | | | |
|---|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | | XX0 | XX1 | XX2 | XX3 |
| CTRL CA | RBC A 1 N | | | | | WBC B N | | | | | | | ... | | | | |
| CTRL DQ | | | | | | | | | | | | | ... | | | | |
| DIE0 DQ | | | | | | DRV D[A] | | | | DRV D[A+1] | | | ... | | DRV D[A*] | | |
| DIE1 DQ | | | | | | SAM D[B] | | | | SAM D[B+1] | | | ... | | SAM D[B*] | | |
| DIE2 DQ | | | | | | | | | | | | | ... | | | | |
| DIE3 DQ | | | | | | | | | | | | | ... | | | | |

| CORE CYCLE | \multicolumn{4}{|c|}{X} | \multicolumn{4}{|c|}{Y} | \multicolumn{4}{|c|}{Z} | ... | \multicolumn{4}{|c|}{XX} |
|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | ... | XX0 | XX1 | XX2 | XX3 |
| CTRL CA | RBC A 1,2 N | | | | | WBC B N | WBC C N | | | | | | ... | | | | |
| CTRL DQ | | | | | | | | | | | | | ... | | | | |
| DIE0 DQ | | | | | | DRV D[A] | DRV D[A] | | | DRV D[A+1] | DRV D[A+1] | | ... | | DRV D[A*] | DRV D[A*] | |
| DIE1 DQ | | | | | | SAM D[B] | | | | SAM D[B+1] | | | ... | | SAM D[B*] | | |
| DIE2 DQ | | | | | | | SAM D[C] | | | | SAM D[C+1] | | ... | | | SAM D[C*] | |
| DIE3 DQ | | | | | | | | | | | | | ... | | | | |

| CORE CYCLE | X | | | | Y | | | | Z | | | | ... | XX | | | |
|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | ... | XX0 | XX1 | XX2 | XX3 |
| CTRL CA | RBC A 1,2 N | | | | | WBC B N | WBC C N | | | | | | ... | | | | |
| CTRL DQ | | | | | | | | | | | | | ... | | | | |
| DIE0 DQ | | | | | | DRV D[A] | DRV D[A] | | | DRV D[A+1] | DRV D[A+1] | | ... | | DRV D[A*] | DRV D[A*] | |
| DIE1 DQ | | | | | | | SAM D[B] | | | | SAM D[B+1] | | ... | | SAM D[B*] | | |
| DIE2 DQ | | | | | | | | SAM D[C] | | | | SAM D[C+1] | ... | | | SAM D[C*] | |
| DIE3 DQ | | | | | | | | | | | | | ... | | | | |

| CORE CYCLE | | X | | | | Y | | | | Z | | | | ... | XX | | | |
|---|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | ... | XX0 | XX1 | XX2 | XX3 |
| CTRL CA | RBC A 1,2 N | | | | | WBC B N | WBC C N | | | | | | ... | | | | |
| CTRL DQ | | | | | | | | | | | | | ... | | | | |
| DIE0 DQ | | | | | | DRV D[A] | DRV D[A] | | | DRV D[A+1] | DRV D[A+1] | | ... | | DRV D [A*] | DRV D [A*] | |
| DIE1 DQ | | | | | | SAM D[B] | | | | SAM D[B+1] | | | ... | | SAM D [B*] | | |
| DIE2 DQ | | | | | | | SAM D[C] | | | | SAM D[C+1] | | ... | | | SAM D [C*] | |
| DIE3 DQ | | | | | | | | | | | | | ... | | | | |

| CORE CYCLE | X | | | | Y | | | | Z | | | | ... | XX | | | |
|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | ... | XX0 | XX1 | XX2 | XX3 |
| CTRL CA | RBC A 2 N | RBC B 3 N | | | | | | WBC C N | | | | WBC D N | ... | | | | |
| CTRL DQ | | | | | | | | | | | | | ... | | | | |
| DIE0 DQ | | | | | | | DRV D[A] | | | | DRV D[A+1] | | ... | | | DRV D[A*] | |
| DIE1 DQ | | | | | | | | DRV D[B] | | | | DRV D[B+1] | ... | | | | DRV D[B*] |
| DIE2 DQ | | | | | | | SAM D[C] | | | | SAM D[C+1] | | ... | | | SAM D[C*] | |
| DIE3 DQ | | | | | | | | SAM D[D] | | | | SAM D[D+1] | ... | | | | SAM D[D*] |

| CORE CYCLE | | X | | | | Y | | | | Z | | | | ... | XX | | | |
|---|---|---|---|---|---|---|---|---|---|---|---|---|---|---|---|---|---|---|
| SLOT | X0 | X1 | X2 | X3 | Y0 | Y1 | Y2 | Y3 | Z0 | Z1 | Z2 | Z3 | ... | XX0 | XX1 | XX2 | XX3 |
| CTRL CA | RBC A 2 N | RBC B 3 N | | | | | WBC C N | WBC D N | | | | | ... | | | | |
| CTRL DQ | | | | | | | | | | | | | ... | | | | |
| DIE0 DQ | | | | | | | DRV D[A] | | | | DRV D[A+1] | | ... | | | DRV D[A*] | |
| DIE1 DQ | | | | | | | | DRV D[B] | | | | DRV D[B+1] | ... | | | | DRV D[B*] |
| DIE2 DQ | | | | | | | SAM D[C] | | | | SAM D[C+1] | | ... | | | SAM D[C*] | |
| DIE3 DQ | | | | | | | | SAM D[D] | | | | SAM D[D+1] | ... | | | | SAM D[D*] |

CONFIGURE A STACK OF MEMORY DEVICES TO COMMUNICATE WITH A CONTROLLER USING RESPECTIVE TIME-DIVISION MULTIPLEXING TIME SLOTS, A FIRST MEMORY DEVICE OF THE STACK OF MEMORY DEVICES BEING CONFIGURED TO USE A FIRST TIME-DIVISION MULTIPLEXING TIME SLOT, A SECOND MEMORY DEVICE OF THE STACK OF MEMORY DEVICES BEING CONFIGURED TO USE A SECOND TIME-DIVISION MULTIPLEXING TIME SLOT
902

CONFIGURE THE FIRST MEMORY DEVICE TO USE THE SECOND TIME-DIVISION MULTIPLEXING TIME SLOT TO COMMUNICATE DIRECTLY WITH THE SECOND MEMORY DEVICE
904

*FIG. 9*

BLOCK COPY

BRIEF DESCRIPTION OF THE DRAWINGS

FIGS. 3A-3C illustrate example time multiplexed operations on a shared direct channel.

FIGS. 4A-4C illustrate an example direct block copy on a shared direct channel.

FIGS. 5A-5C illustrate an example multiple destination direct block copy on a shared direct channel.

FIGS. 6A-6B illustrate an example of concurrent block copies on a shared direct channel.

FIG. 9 is a flowchart illustrating a method of direct communication among memory devices in a device stack.

DETAILED DESCRIPTION OF THE EMBODIMENTS

In an embodiment, an interconnected stack of one or more Dynamic Random Access Memory (DRAM) die has one or more custom logic, controller, or processor die. Custom die may be attached as a last step and interconnected vertically with the DRAM die(s) by shared through-silicon via (TSV) connections that carry data and control signals throughout the stack. The custom die(s) of the stack may include interfaces that allow direct access to memory regions on one or more DRAMs in the stack. These interfaces may access DRAM memory regions via TSVs that are not used for I/O outside of the stack. These additional (e.g., per processing element) interfaces allow processing elements to have more direct access to the data in the DRAM stack than using other I/O's. These direct memory channels allow more rapid access to the data in the DRAM stack.

In an embodiment, the direct memory channels (direct channels) interconnect one or more DRAM regions on each DRAM die of the stack to the custom die. The direct channels may comprise command, address, and data busses that are shared between the multiple DRAM dies and the custom die. The direct channels are time-division multiplexed such that each DRAM die is associated with a time slot on a direct channel. The time slots may be configured such that each DRAM region is able to cycle at its core frequency while the custom die receives/transmits at a multiple of that core frequency. For example, if there are four DRAM dies in the stack, each DRAM die may generally transmit and/or receive in a unique one of 4 time slots while the custom die transmits and/or receives every time slot. Thus, the time slot assigned to a DRAM die may be used by the custom die to uniquely identify/address the die.

In an embodiment, the custom die configures a first DRAM die to read a block of data and transmit it via the intra-device stack interconnect using a time slot that is assigned to a second DRAM die. The custom die also configures the second memory device to receive the first block of data in its 'normal' (i.e., assigned) time slot and write the block of data. In this manner, the block of data is communicated directly between the first DRAM die and the second DRAM die without passing via the custom die. By not passing the block of data via the custom die, the additional time slots and latency that would be associated with the custom die receiving and then re-transmitting the block of data are avoided.

Figure 1:
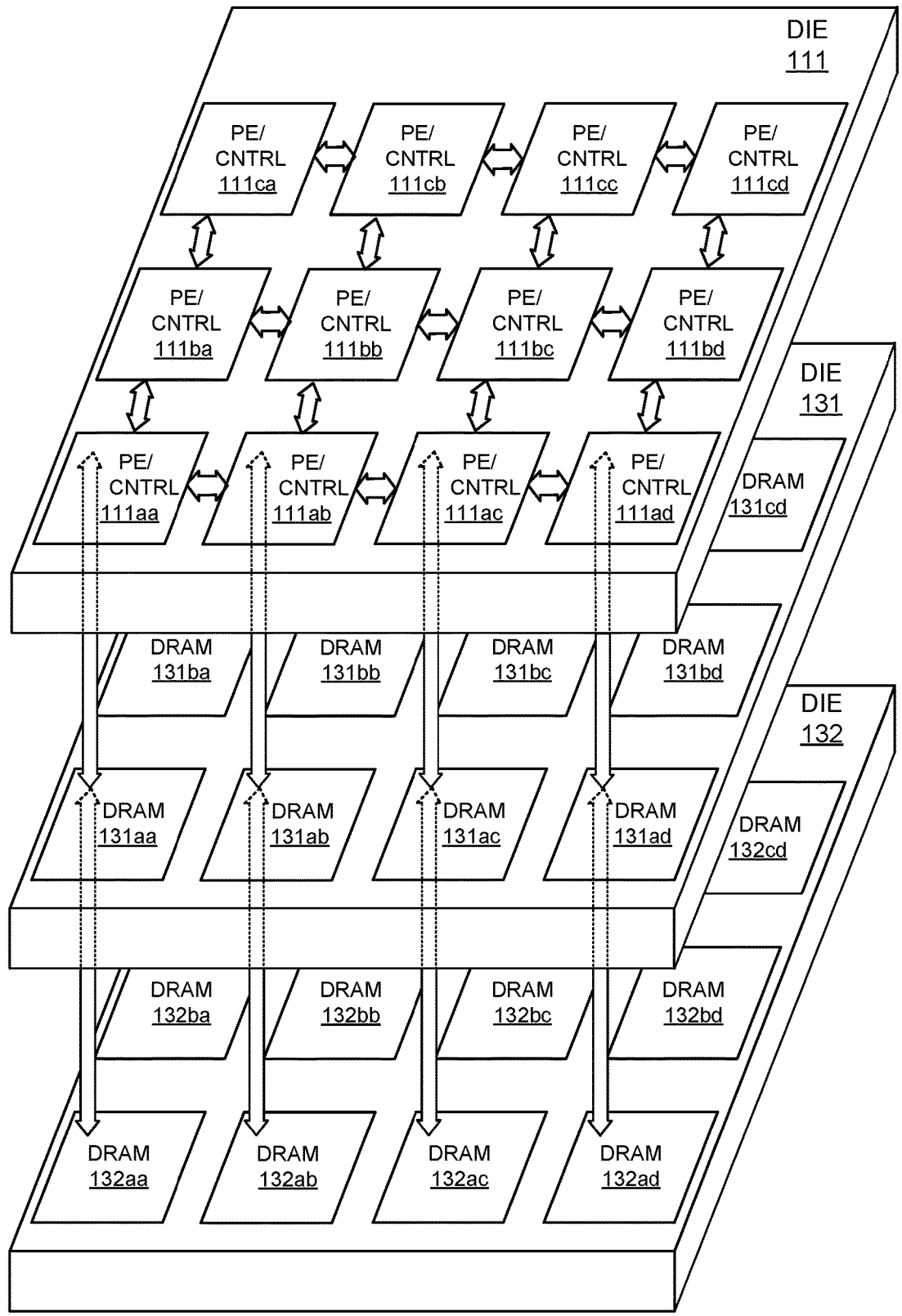
FIG. 1 is an isometric illustration of an integrated circuit device stack.

FIG. 1 is an isometric illustration of an integrated circuit device stack. In FIG. 1, processing system 100 comprises integrated circuit die 111, memory device die 131, and memory device die 132. Integrated circuit die 111, memory device die 131, and memory device die 132 are stacked with each other. Integrated circuit die 111 includes a two-dimensional array with 3 rows and 4 columns of processing elements (PEs) and/or controllers 111aa-111cd. In other words, die 111, and processing elements 111aa-111cd in particular, may be or include memory controller circuitry and optionally other processing circuitry (e.g., a CPU). Memory device die 131 is illustrated with two-dimensional array with 3 rows and 4 columns of memory regions 131aa-131cd. Likewise, memory device die 132 is illustrated with two-dimensional array with 3 rows and 4 columns of memory regions 132aa-132cd. It should be understood that the selection of 3 rows and 4 columns is merely for the purposes of illustration. Any number of rows and/or columns are contemplated. Note that in FIG. 1, some DRAM regions (e.g., DRAM regions 131ca-131cc 132ca-132cc) are obscured by die 111 or memory device die 131 and are therefore not visible in FIG. 1.

In an embodiment of processing system 100, each PE/controller 111aa-111cd of integrated circuit die 111 is intercoupled to its nearest neighbors in the left and right directions and the front and back directions. In another embodiment of processing system 100, one or more of PE/controllers 111aa-111cd (including all) of integrated circuit die 111 may not be intercoupled to another of PE/controllers 111aa-111cd or intercoupled to more than one of the other PE/controllers 111aa-111cd. In these embodiments, a two-dimensional array is illustrated in FIG. 1 as being on integrated circuit die 111. The intercoupling may comprise intercoupling circuitry that includes, but is not limited to, input and/or output (I/O) circuitry, buffer circuitry, parallel buses, serial busses, through-silicon via (TSV) connections, and the like. Thus, for example, PE/controller 111bb lies between PE/controller 111ba and PE/controller 111bc in the left and right directions. PE/controller 111bb therefore may be intercoupled with both PE/controller 111ba and PE/controller 111bc. Also as an example, PE/controller 111bb lies between PE/controller 111cb and PE/controller 111ab in the front and back directions. PE/controller 111bb may therefore also be intercoupled with PE/controller 111cb and PE/controller 111ab. This pattern of being intercoupled with zero, one, or more, of the respective adjacent left-to-right (if present) and front-to-back (if present) PE/controller 111aa-111cd may be repeated for any number of and combinations of PE/controllers 111aa-111cd.

In an embodiment, PE/controllers 111aa-111cd and DRAM regions 131aa-131cd 132aa-132cd have the same size such that each PE/controllers 111aa-111cd on integrated circuit die 111 lies above respective DRAM regions 131aa-131cd 132aa-132cd on memory device die 131 and memory device die 132. Each PE/controller 111aa-111cd is also intercoupled with the corresponding DRAM regions 131aa-131cd 132aa-132cd that are above (or in another embodiment, below) that respective PE/controller 111aa-111cd. In other words, DRAM region 131aa lies directly below PE/controller 111aa and is intercoupled with PE/controller 111aa; DRAM region 132aa also lies directly below PE/controller 111*aa* and is intercoupled with PE/controller 111*aa*; DRAM region 131*ab* lies directly below PE/controller 111*ab* and is intercoupled with PE/controller 111*ab*; DRAM region 132*ab* also lies directly below PE/controller 111*ab* and is intercoupled with PE/controller 111*ab*, and so on. This vertical intercoupling is illustrated in FIG. 1 by the bidirectional arrows running from PE/controllers 111*aa*-111*ad* on integrated circuit die 111 to corresponding DRAM regions 131*aa*-131*cd* 132*aa*-132*cd* on memory device die 131 and memory device die 132. It should be understood that PE/controllers 111*ba*-111*cd* on integrated circuit die 111 are intercoupled to corresponding DRAM regions 131*ba*-131*cd* 132*ba*-132*cd* on memory device die 131 and memory device die 132. However, these arrows have been omitted from FIG. 1 because integrated circuit die 111 or memory device die 131 is at least partially obscuring them in the isometric view of FIG. 1.

It should be understood that, for the sake of brevity and clarity, only three dies 111, 131, and 132 are illustrated in FIG. 1. One or more additional dies, with additional two-dimensional arrays of PE/controllers, and/or DRAMs may be stacked with dies 111, 131, and 132 and intercoupled with PE/controllers 111*aa*-111*cd* in a like manner. These additional dies may form additional layers of two-dimensional PE/controller arrays so that the resulting three-dimensional PE/controller array has more than one layer in the vertical direction. Similarly, additional dies may form additional layers of memory devices so that the resulting three-dimensional memory device array has more than two layers in the vertical direction.

Each PE/controller 111*aa*-111*cd* may have associated memory which may be DRAM or SRAM (not shown in FIG. 1.) PE/controllers 111*aa*-111*cd* may include both processing logic, controller logic, and the associated memory on the same die.

In an embodiment, a PE/controller 111*aa*-111*cd* (e.g., PE/controller 111*aa*) may configure a DRAM regions 131*aa*-131*cd* 132*aa*-132*cd* it is intercoupled with in the vertical direction (e.g., DRAM region 131*aa*) to read a block of data and transmit the block of data to another DRAM region 131*aa*-131*cd* 132*aa*-132*cd* it is intercoupled with in the vertical direction (e.g., DRAM region 132*aa*). The PE/controller 111*aa*-111*cd* (e.g., PE/controller 111*aa*) may also configure the second DRAM region (e.g., DRAM region 132*aa*) to receive the block of data directly (i.e., without being re-transmitted by the PE/controller 111*aa*-111*cd*) from the transmitting DRAM region (e.g., DRAM region 131*aa*) and to write the block of data into the second DRAM region (e.g., DRAM region 132*aa*).

In an embodiment, PE/controllers 111*aa*-111*cd* communicate with the corresponding DRAM regions 131*aa*-131*cd* 132*aa*-132*cd* via the intra-device stack interconnect using time-division multiplexing. For example, PE/controllers 111*aa*-111*cd* may communicate with the corresponding DRAM regions 131*aa*-131*cd* 132*aa*-132*cd* using time allocations the repeat (a.k.a., cycled) at the DRAM region 131*aa*-131*cd* 132*aa*-132*cd* array cycle time (a.k.a., core cycle time). Thus, for example, each corresponding DRAM region 131*aa*-131*cd* 132*aa*-132*cd* may be allocated a time slot that repeats at a frequency substantially equal to the frequency that it is cycling its memory array(s). Different corresponding DRAM regions 131*aa*-131*cd* 132*aa*-132*cd* (e.g., DRAM region 131*aa* and DRAM region 132*aa*) may be configured to use different ones of the time slots—but still repeating at the core frequency—to communicate with the corresponding PE/controllers 111*aa*-111*cd*.

In an embodiment, a PE/controller 111*aa*-111*cd* (e.g., PE/controller 111*aa*) configures a DRAM region 131*aa*-131*cd* 132*aa*-132*cd* to transmit a read block of data to another DRAM region 131*aa*-131*cd* 132*aa*-132*cd* by configuring (or equivalently, indicating, instructing, or commanding) the transmitting DRAM regions 131*aa*-131*cd* 132*aa*-132*cd* to transmit the data using the another DRAM region's 131*aa*-131*cd* 132*aa*-132*cd* time slot. The PE/controller 111*aa*-111*cd* (e.g., PE/controller 111*aa*) may also configure (or equivalently, indicate, instruct, or command) the receiving DRAM regions 131*aa*-131*cd* 132*aa*-132*cd* (e.g., DRAM region 132*aa*) to receive the block of data directly (i.e., without being re-transmitted by the PE/controller 111*aa*-111*cd*) from the transmitting DRAM regions 131*aa*-131*cd* 132*aa*-132*cd* (e.g., DRAM region 131*aa*) by configuring the receiving DRAM regions 131*aa*-131*cd* 132*aa*-132*cd* to receive the block of data in its assigned time slot. The PE/controller 111*aa*-111*cd* (e.g., PE/controller 111*aa*) may configure the receiving DRAM regions 131*aa*-131*cd* 132*aa*-132*cd* to receive the block of data in its assigned time slot by indicating to the receiving DRAM regions 131*aa*-131*cd* 132*aa*-132*cd* that the PE/controller 111*aa*-111*cd* is writing a block of data to the receiving DRAM regions 131*aa*-131*cd* 132*aa*-132*cd* and then the PE/controller 111*aa*-111*cd* refrains from transmitting data so that the data received by the receiving DRAM regions 131*aa*-131*cd* 132*aa*-132*cd* in its assigned time slot comes from the transmitting DRAM regions 131*aa*-131*cd* 132*aa*-132*cd*.

In an embodiment, the intra-device stack interconnect that allows PE/controller 111*aa*-111*cd* to communicate with the corresponding (e.g., vertically aligned) DRAM regions 131*aa*-131*cd* 132*aa*-132*cd* includes a command/address interface/bus to communicate commands and addresses with corresponding DRAM regions 131*aa*-131*cd* 132*aa*-132*cd* via a first set of shared (by PE/controller 111*aa*-111*cd* and corresponding DRAM regions 131*aa*-131*cd* 132*aa*-132*cd*) interconnections. These command/address communications may use time-division multiplexing to separate communication between PE/controller 111*aa*-111*cd* and each of the corresponding DRAM regions 131*aa*-131*cd* 132*aa*-132*cd*.

The intra-device stack interconnect that allows PE/controller 111*aa*-111*cd* to communicate with the corresponding (e.g., vertically aligned) DRAM regions 131*aa*-131*cd* 132*aa*-132*cd* also includes a data interface/bus to communicate data with the corresponding DRAM regions 131*aa*-131*cd* 132*aa*-132*cd* via a second set of shared interconnections. These data communications may use time-division multiplexing to separate communication between PE/controller 111*aa*-111*cd* and each of the corresponding DRAM regions 131*aa*-131*cd* 132*aa*-132*cd*. This time-division multiplexed separation includes separating communication to/from each of the DRAM regions 131*aa*-131*cd* 132*aa*-132*cd* to/from PE/controller 111*aa*-111*cd*, and communication between DRAM regions 131*aa*-131*cd* 132*aa*-132*cd*.

In an embodiment, a PE/controller 111*aa*-111*cd* may configure a first corresponding DRAM region 131*aa*-131*cd* 132*aa*-132*cd* (e.g., DRAM region 131*aa*) to transmit data (e.g., via the data interface/bus) in a time slot that is assigned to a second corresponding DRAM region 131*aa*-131*cd* 132*aa*-132*cd* (e.g., DRAM region 132*aa*) for communication with the PE/controller 111*aa*-111*cd*. The PE/controller 111*aa*-111*cd* may also configure the second corresponding DRAM region 131*aa*-131*cd* 132*aa*-132*cd* (e.g., DRAM region 132*aa*) to receive data from first corresponding DRAM region 131*aa*-131*cd* 132*aa*-132*cd* (e.g., DRAM region 131*aa*) in the first time slot. For example, the PE/controller 111aa-111cd (e.g., PE/controller 111aa) may configure the second corresponding DRAM region 131aa-131cd 132aa-132cd (e.g., DRAM region 132aa) to receive data in the first time slot by indicating to the second corresponding DRAM region 131aa-131cd 132aa-132cd (e.g., DRAM region 132aa) that the PE/controller 111aa-111cd is writing a block of data to the second corresponding DRAM region 131aa-131cd 132aa-132cd (e.g., DRAM region 132aa). When the first time slot occurs, however, PE/controller 111aa-111cd does not drive data onto the data interface/bus. Rather, the first corresponding DRAM region 131aa-131cd 132aa-132cd (e.g., DRAM region 131aa) drives data in the first time slot. Thus, the data the second corresponding DRAM region 131aa-131cd 132aa-132cd (e.g., DRAM region 132aa) receives in the first time slot comes directly from first corresponding DRAM region 131aa-131cd 132aa-132cd (e.g., DRAM region 131aa) without being re-transmitted by the PE/controller 111aa-111cd (e.g., PE/controller 111aa). In an embodiment, the PE/controller 111aa-111cd (e.g., PE/controller 111aa) may also receive the data transmitted by the first corresponding DRAM region 131aa-131cd 132aa-132cd (e.g., DRAM region 131aa). The PE/controller 111aa-111cd (e.g., PE/controller 111aa) may also receive the data transmitted by the first corresponding DRAM region 131aa-131cd 132aa-132cd (e.g., DRAM region 131aa) using one or more of the first time slot, or a second time slot assigned to the first corresponding DRAM regions 131aa-131cd 132aa-132cd (e.g., DRAM region 131aa) for communication with the PE/controller 111aa-111cd (e.g., PE/controller 111aa).

Figure 2:
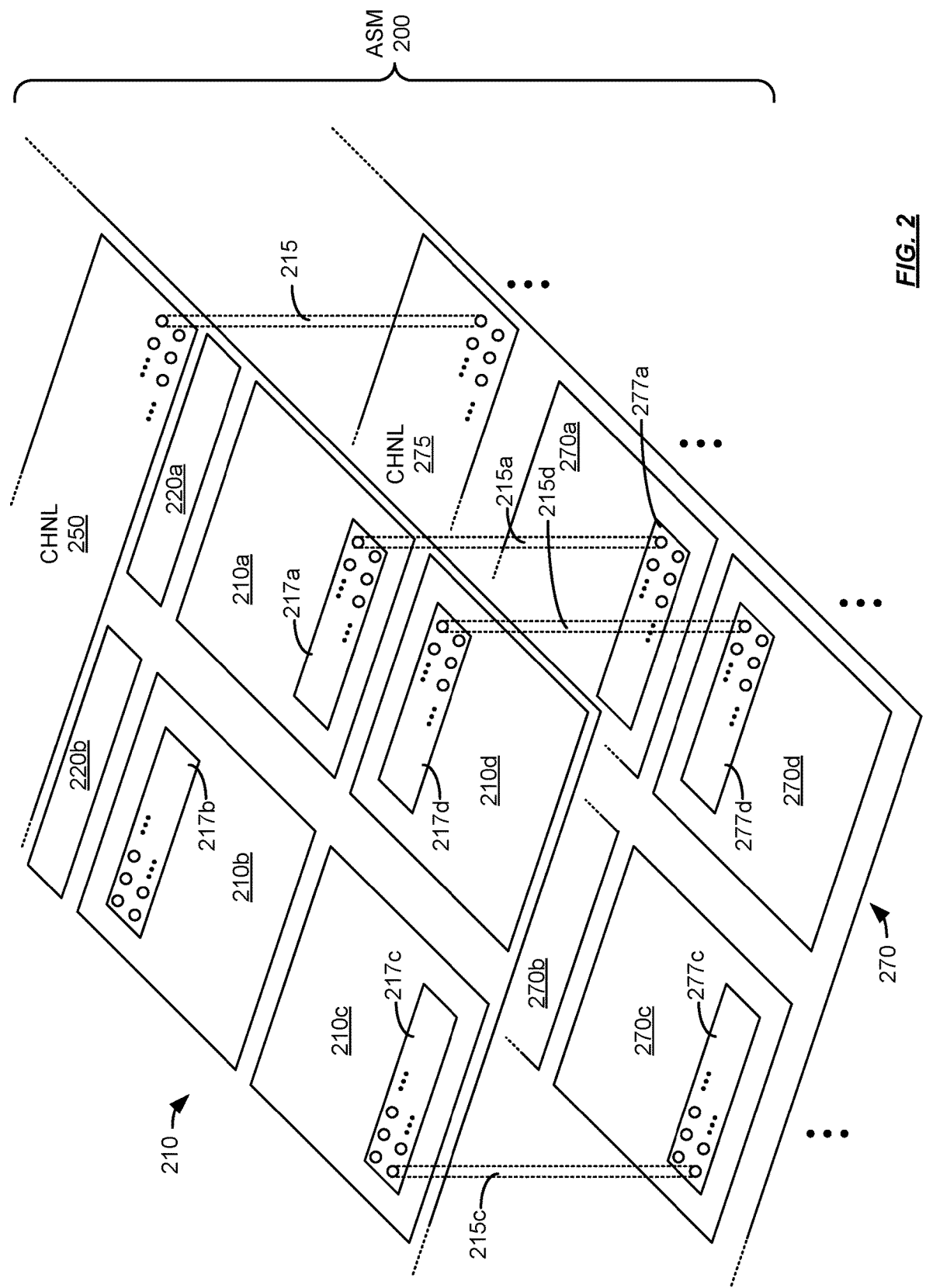
FIG. 2 is an isometric illustration of a high-bandwidth memory (HBM) compatible integrated circuit device stack.

FIG. 2 is an isometric illustration of a high-bandwidth memory (HBM) compatible integrated circuit device stack. In FIG. 2, assembly 200 includes processing/controller die 210 stacked with DRAM die 270. It should be understood that additional DRAM dies are included in assembly 200. However, these are not illustrated in FIG. 2 because of illustration constraints. Assembly 200 may be, for example, an implementation of system 100. Processing/controller die 210 includes channel connections (e.g., TSVs) 250, buffers 220a-220b, and PE/controllers 210a-210d. PE/controllers 210a-210d include and/or are coupled to TSV connections 217a-217d, respectively. In an embodiment, channel connections 250 of processing/controller die 210 are connection compatible with an HBM standard.

DRAM die 270 includes channel connections (e.g., TSVs) 275 and DRAM memory regions 270a-270d. In an embodiment, each DRAM memory region might consist of one or more DRAM memory banks and may include additional circuitry (e.g. to control, connect to, and/or drive TSV connections 217a-217d, and/or included DRAM banks). DRAM memory regions 270a, 270c, and 270d include and/or are coupled to TSV connections 277a, 277c, and 277d, respectively. DRAM memory region 270b also includes and/or is coupled to TSV connections. However, in FIG. 2, these TSV connections are obscured by processing die 210 and are therefore not illustrated in FIG. 2. In an embodiment, channel 215 of DRAM die 210 are connection compatible with an HBM standard.

TSV connections 217a, 217c, and 217d of PE/controllers 210a, 210c, and 210d of processing/controller die 210 are aligned with TSV connections 277a, 277c, and 277d of DRAM regions 270a, 270c, and 270d of DRAM die 270, respectively and the TSV connections of the other DRAM dies in assembly 200. Likewise, TSV connections 217b of PE/controller 210b of processing/controller die 210 are aligned with the obscured (in FIG. 2) TSV connections of DRAM region 270b. Channel connections 250 of processing/controller die 210 are aligned with channel connections 275 of DRAM die 270 and the channel connections of the other DRAM dies in assembly 200. Thus, when processing/controller die 210, DRAM die 270, and the other DRAM dies in assembly 200 are stacked with each other, TSV connections 217a-217d of PE/controllers 210a-210d of processing/controller die 210 are electrically connected to TSV connections (e.g., 277a, 277c, and 277d) of DRAM regions 270a-270d of DRAM die 270 and the TSV connections of the other DRAM dies in assembly 200. This is illustrated in FIG. 2 by TSV representations 215a, 215c, and 215d. Likewise, channel connections 250 of processing/controller die 210 are electrically connected to with channel connections 275 of DRAM die 270 and the channel connections of the other DRAM dies in assembly 200. This is illustrated in FIG. 2 by TSV representation 215.

TSV connections between PE/controllers 210a-210d, DRAM regions 270a-270d, and the other DRAM regions in assembly 200 form direct channels and allow PE/controllers 210a-210d to access DRAM regions 270a-270d and the DRAM regions of the other DRAM dies in assembly 200. TSV connections between PE/controllers 210a-210d, DRAM regions 270a-270d, and the DRAM regions of the other DRAM dies in assembly 200 form direct channels and allow PE/controllers 210a-210d to access DRAM regions 270a-270d and the DRAM regions of the other DRAM dies in assembly 200 without the data flowing via channel connections 250 and/or channel connections 275. In addition, the direct channels formed by TSV connections between PE/controllers 210a-210d, DRAM regions 270a-270d, and the DRAM regions of the other DRAM dies in assembly 200 allow PE/controllers 210a-210d to access respective DRAM regions 270a-270d and the DRAM regions of the other DRAM dies in assembly 200 independently of each other. PE/controllers 210a-210d accessing respective DRAM regions 270a-270d and the DRAM regions of the other DRAM dies in assembly 200 independently of each other allow PE/controllers 210a-210d to access respective DRAM regions 270a-270d and the DRAM regions of the other DRAM dies in assembly 200 in parallel and/or concurrently—thereby providing a high memory-to-processing element bandwidth and lower latency.

In an embodiment, the direct channels formed by the TSV connections between PE/controllers 210a-210d, DRAM regions 270a-270d, and the DRAM regions of the other DRAM dies in assembly 200 may be made in a common bus type configuration. Communication of commands, addresses, and data between PE/controllers 210a-210d, DRAM regions 270a-270d, and the DRAM regions of the other DRAM dies in assembly 200 on respective common command/address and data busses may use time-division multiplexing. Communication of commands, addresses, and data between PE/controllers 210a-210d, DRAM regions 270a-270d, and the DRAM regions of the other DRAM dies in assembly 200 on a respective common bus may use time-division multiplexing by assigning each of DRAM regions 270a-270d, and the DRAM regions of the other DRAM dies in assembly 200 a repeating time slot to communicate with the PE/controller 210a-210d on the common bus. For example, DRAM region 270c may be assigned a first repeating time slot to communicate with (i.e., to and from) PE/controller 210c via TSVs 277c and TSVs 217c; another of DRAM region positioned above or below PE/controller 210c may be assigned a second repeating time slot to communicate with (i.e., to and from) PE/controller 210c via TSVs 217c that is different and non-overlapping with the first time slot; yet another DRAM region positioned above or below PE/controller 210c may be assigned a third repeating time slot that is non-overlapping with the first and second time slots, and so on.

In an embodiment, a PE/controller 210a-210d may configure (or indicate, instruct, or command) a DRAM region positioned above or below that PE/controller 210a-210d to copy data, or a block of data, from that DRAM region directly to another DRAM region positioned above or below that PE/controller 210a-210d.

For example, PE/controller 210c may configure DRAM region 270c to copy a block of data from DRAM region 270c to another DRAM region (not shown in FIG. 2) that is positioned above or below PE/controller 210c via TSVs 277c and without the block of data being re-transmitted by PE/controller 210c. For example, DRAM region 270c (the data source) may be assigned to use a first time slot for communication with PE/controller 210c. The other DRAM region (the data destination) may be assigned to use a second time slot for communication with PE/controller 210c. PE/controller 210c may configure DRAM region 270c to transmit the data during the second time slot while the other DRAM region is configured to receive data during the second time slot. In this manner, the other DRAM region receives the data without the data being re-transmitted by PE/controller 210c. In an embodiment, the other (destination) DRAM region may be unaware that the data is coming from DRAM region 270c rather than PE/controller 210c.

It should be understood, that one or more of the functions, operations, configurations, etc. described herein with respect to system 100 may also be accomplished by system 200. Thus, for the sake of brevity, a discussion of these functions, operations, configurations, etc. will not be repeated herein in with respect to FIG. 2 and system 200.

FIGS. 3A-3C illustrate example time multiplexed operations on a shared direct channel. In FIGS. 3A-3C, a first row illustrates three consecutive core cycles, labeled "X", "Y", and "Z" are illustrated. A fourth core cycle, which occurs a number of other core cycles (not illustrated in FIGS. 3A-3C) after the "Z" core cycles is labeled "XX". A second row illustrates that each core cycle is further divided into four time slots labeled with the core cycle and a time slot number. Thus, the first time slot of core cycle "X" is labeled "X0"; the second time slot "X1", and so on. A third row illustrates a mnemonic for the content being driven by a controller onto the direct channel's command/address bus. A fourth row illustrates a mnemonic for the action being taken by the controller's with respect to the direct channel's data bus. The fifth, sixth, seventh, and eighth rows illustrates the actions being taken by a first (die0), second (die1), third (die2), and fourth (die3), respectively, memory device in the device stack with respect to the direct channel's data bus. The selection of four memory devices (i.e., die0-die3) in the device stack being controlled by a single controller die is merely for illustration purposes. Other numbers of memory devices and corresponding embodiments with different numbers of time slots per core cycle are contemplated. The contents of FIG. 3A are reproduced in Table 1.

TABLE 1

| | core cycle | | | | | | | | | | | | | | | |
|---|---|---|---|---|---|---|---|---|---|---|---|---|---|---|---|---|
| | X | | | | Y | | | | Z | | | | XX | | | |
| | slot | | | | | | | | | | | | | | | |
| | X0 | X1 | X2 | X3 | Y0 | Y1 | Y2 | Y3 | Z0 | Z1 | Z2 | Z3 | XX0 | XX1 | XX2 | XX3 |
| Ctrl CA | rd A | wr B | | rd C | | wr D | rd E | rd F | wr G | | | | | | | |
| Ctrl DQ | | drv D[B] | | | sam D[A] | drv D[D] | | sam D[C] | drv D[G] | | sam D[E] | sam D[F] | | | | |
| Die0 DQ | | | | | drv D[A] | | | | sam D[G] | | | | | | | |
| Die1 DQ | | sam D[B] | | | | sam D[D] | | | | | | | | | | |
| Die2 DQ | | | | | | | | | | | drv D[E] | | | | | |
| Die3 DQ | | | | | | | | | drv D[C] | | | drv D[F] | | | | |

In FIGS. 3A-3C, the controller command/address mnemonics include read (RD) and write (WR) commands. Thus, for example, the controller drives a "read die0 at address 'A'" command and address onto the direct channel's command/address (CA) bus in time slot X0. This is illustrated in FIGS. 3A-3C by the "RD A" mnemonic in the controller CA (CTRL CA) row and X0 column. In another example, the controller drives a "write to die1 at address 'B'" command and address onto the direct channel's command/address (CA) bus in time slot X1 while also driving the data (D[address]) to be written on the controller's data (DQ) interface in time slot X1. This is illustrated in FIGS. 3A-3C by: the "WR B" mnemonic in the controller CA row and X1 column; the "DRV D[B]" mnemonic (drive data to be stored at location 'B') in the controller DQ row and X1 column; and the "SAM D[B]" mnemonic (sample data to be stored at location 'B') in the die1 DQ row and X1 column. Thus, it should be understood that the time slot may be used by the controller of the direct channel as a means of addressing which memory device die is the target for the command being driven by the controller. Similarly, each die is assigned a different time slot to transmit and receive data to/from the controller via the shared data bus of the direct channel.

FIG. 3B illustrates a read operation on an embodiment of a direct channel of location "A" in die0 of a device stack. In FIG. 3B, the controller transmits a "read location A" command to die0 by driving a read command and the address "A" on the direct channel CA bus in time slot X0. Because time slot 0 of each core cycle (X, Y, Z, . . . XX) is assigned to die0, die0 monitors each time slot 0 on the direct channel CA bus and receives the read command and address "A". In FIG. 3B, a core cycle later, in time slot Y0, die0 drives the data read from its address "A" location (D[A]) on the direct channel's DQ bus. This is illustrated in FIG. 3B by arrow 351. While die0 is driving D[A] on the direct channel's DQ bus, the controller samples the DQ bus during time slot Y0 to receive D[A]. This is illustrated in FIG. 3B by arrow 352. It should be understood that the timing of a single core cycle between the command and return of the data is merely for illustrative purposes. One or more core cycles (e.g., 2, 3, 4, etc.) between the command and return of the data are contemplated.

FIG. 3C illustrates a write operation on an embodiment of a direct channel of location "B" in die1 of a device stack. In FIG. 3C, the controller transmits a "write location B" command to die1 by driving a write command and the address "B" on the direct channel CA bus in time slot X1. Because time slot 1 of each core cycle (X, Y, Z, . . . XX) is assigned to die1, die1 monitors each time slot 1 on the direct channel CA bus and receives the write command and the address "B". In the corresponding X1 time slot on the DQ bus, the controller drives the data to be written to location "B" (D[B]) on the direct channel's DQ bus. This is illustrated in FIG. 3C by arrow 353. While the controller is driving D[B] on the direct channel's DQ bus, die1 samples the DQ bus during time slot X1 to receive D[B]. This is illustrated in FIG. 3C by arrow 354. Die1 then writes D[B] to location "B" in its memory array.

Figure 4B:
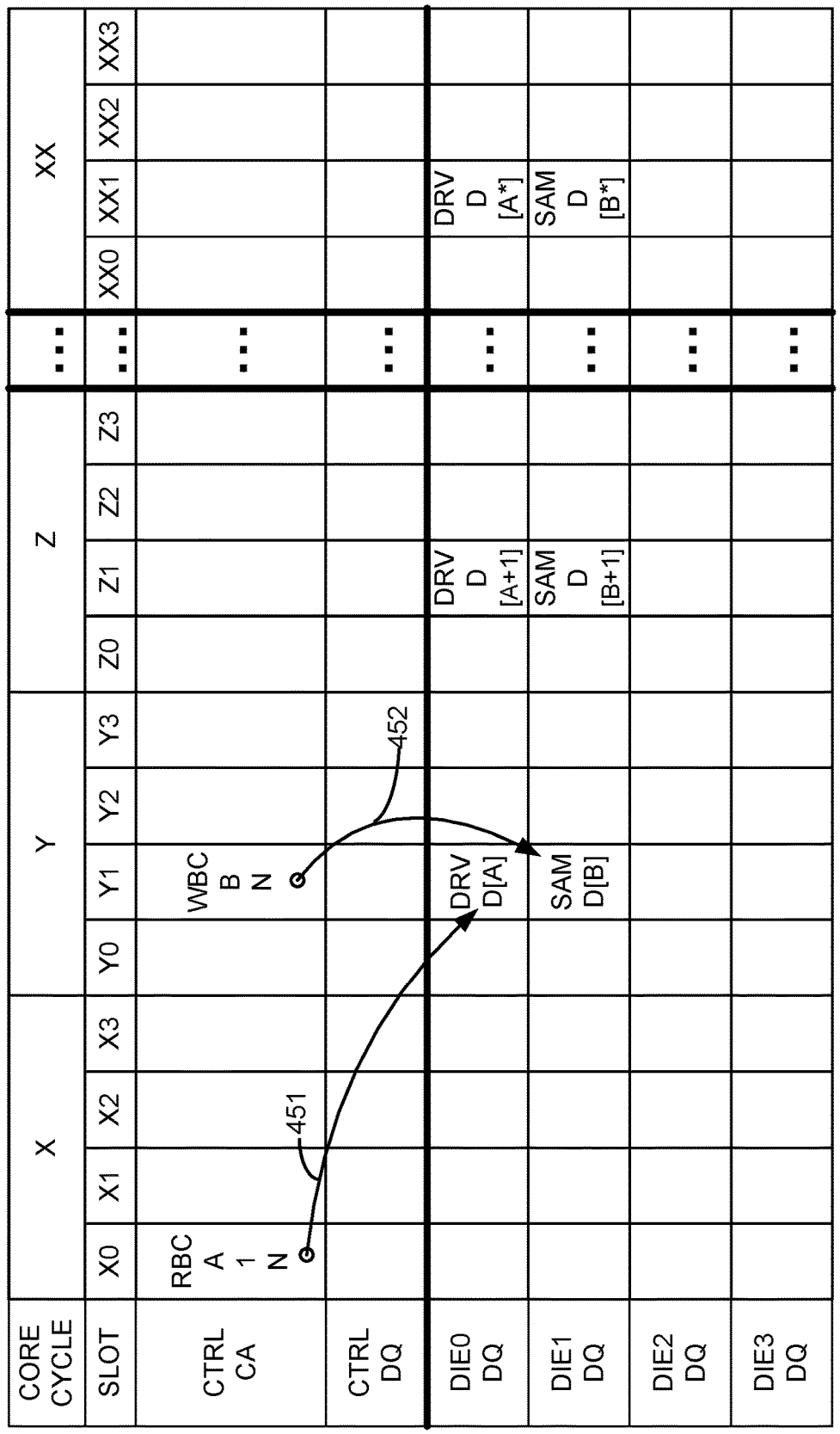

FIGS. 4A-4C illustrate an example direct block copy on a shared direct channel. FIGS. 4A-4C have the same rows and column definitions as FIGS. 3A-3C. The contents of FIG. 4A are reproduced in Table 2.

In FIGS. 4A-4C, the controller command/address mnemonics include read block copy (RBC) and write block copy (WBC) commands. Thus, for example, the controller drives a "read a block of size N from die0 at starting address 'A' and copy it directly to die1" command, address, size, and destination die onto the direct channel's command/address (CA) bus in time slot X0. This is illustrated in FIGS. 4A-4C by the "RBC A 1 N" mnemonic in the controller CA (CNTLR CA) row and X0 column. To configure die1 to receive the data for the block copy, the controller drives a "write a block of size N starting at address 'B'" command, address, and size onto the direct channel's command/address (CA) bus in time slot Y1. This is illustrated in FIGS. 4A-4C by: the "WBC B N" mnemonic in the controller CA row and Y1 column.

FIGS. 4B-4C illustrate a direct block copy operation on an embodiment of a direct channel of data starting at location "A" and of size "N" from die0 of a device stack to starting location "B" in die1. In FIG. 4B, the controller transmits a "read a block of size N from die0 at starting address 'A' and copy it directly to die1" command, address, size, and destination die onto the direct channel's command/address (CA) bus in time slot X0. Because time slot 0 of each core cycle (X, Y, Z, . . . XX) is assigned to die0, die0 monitors each time slot 0 on the direct channel CA bus and receives the read block copy command, address "A", destination die, and size of the block to be copied. At least one core cycle later, in time slot Y1, die0 drives the first unit of data read from its address "A" location (D[A]) on the direct channel's DQ bus. This is illustrated in FIG. 4B by arrow 451. While die0 is driving D[A] on the direct channel's DQ bus in the time slot associated with die1 (Y1), the controller drives a "write a block of size N starting at address 'B'" command, address, and size onto the direct channel's command/address (CA) bus in time slot Y1. This causes die1 to save the sample of the DQ bus made during time slot Y1 to receive D[A] and write it to location "B" (D[B]) of die1. This is illustrated in FIG. 4B by arrow 452.

At least one core cycle later, in time slot Z1, die0 drives the next unit of data read from its address "A+1" location (D[A+1]) on the direct channel's DQ bus. This is illustrated in FIG. 4C by arrow 453 and the "DRV D[A+1]" in die1's row and time slot Z1. Die1 saves the sample of the DQ bus made during time slot Z1 to receive D[A+1] and write it to location "B+1" (D[B+1]) of die1. This is illustrated in FIG. 4C arrow 454 and the "SAM D[B+1]" in die1's row and time slot Z1. This process of driving successive data units by die0 and sampling of those data units by die1 directly from the direct channels DQ bus continues until N units have been directly copied from die0 to die1. It should be understood that A may equal B, or A may not be equal to B.

In an embodiment, the RBC and WBC commands need only be sent once to initiate the direct block copy and to configure the destination die to receive (and write) the copied data. In another embodiment, the RBC and WBC commands may be transmitted every core cycle. In this embodiment, the controller may scramble or rearrange the sequence data is either read or written. For example, while data is read in order or reverse order (i.e., location A, A+1, A+2, etc. or location A, A−1, A−2, etc.), it may be written in either order or reverse order (i.e., location B, B+1, B+2, etc. or location B, B−1, B−2, etc.). In another embodiment, the RBC or WBC commands may indicate an order to the source or destination die and the memory device(s) handle the reordering of the data before it is read or written.

TABLE 2

| | | | | | | | | | | | | | core cycle | | | |
| --- | --- | --- | --- | --- | --- | --- | --- | --- | --- | --- | --- | --- | --- | --- | --- | --- |
| | | X | | | | Y | | | | Z | | | | XX | | |
| | | | | | | | | slot | | | | | | | | |
| | | | | | | | | | | | | | XX | XX | XX | XX |
| | | X0 | X1 | X2 | X3 | Y0 | Y1 | Y2 | Y3 | Z0 | Z1 | Z2 | Z3 | 0 | 1 | 2 | 3 |
| Ctrl CA | | rbc A 1 N | | | | | wbc B N | | | | | | | | | | |
| Ctrl DQ | | | | | | | | | | | | | | | | | |
| Die0 DQ | | | | | | | drv D[A] | | | | drv D[A + 1] | | | | drv D[A + N − 1] | | |
| Die1 DQ | | | | | | | sam D[B] | | | | sam D[B + 1] | | | | sam D[B + | | |

TABLE 2-continued

| | core cycle | | | | | | | | | | | | | | | |
|---|---|---|---|---|---|---|---|---|---|---|---|---|---|---|---|---|
| | X | | | | Y | | | | Z | | | | XX | | | |
| | | | | | | | slot | | | | | | | | | |
| | X0 | X1 | X2 | X3 | Y0 | Y1 | Y2 | Y3 | Z0 | Z1 | Z2 | Z3 | XX 0 | XX 1 | XX 2 | XX 3 |
| Die2 DQ | | | | | | | | | | | | | | | | |
| Die3 DQ | | | | | | | | | | | | | | N – 1] | | |

FIGS. 5A-5C illustrate an example multiple destination direct block copy on a shared direct channel. FIGS. 5A-5C have the same rows and column definitions as FIGS. 3A-3C and 4A-4C. The contents of FIG. 5A are reproduced in Table 3.

In FIGS. 5A-5C, the controller drives a "read a block of size N from die0 at starting address 'A' and copy it directly to die1 and die2" command, address, size, and destination die onto the direct channel's command/address (CA) bus in time slot X0. This is illustrated in FIGS. 5A-5C by the "RBC A 1,2 N" mnemonic in the controller CA (CNTLR CA) row and X0 column. To configure die1 to receive the data for the block copy, the controller drives a "write a block of size N starting at address 'B'" command, address, and size onto the direct channel's command/address (CA) bus in time slot Y1. This is illustrated in FIGS. 5A-5C by: the "WBC B N" mnemonic in the controller CA row and Y1 column. To configure die2 to receive the data for the block copy, the controller drives a "write a block of size N starting at address 'C'" command, address, and size onto the direct channel's command/address (CA) bus in time slot Y2. This is illustrated in FIGS. 5A-5C by: the "WBC C N" mnemonic in the controller CA row and Y2 column.

FIGS. 5B-5C illustrates a multiple destination direct block copy operation on an embodiment of a direct channel of data starting at location "A" and of size "N" from die0 of a device stack to starting location "B" in die1 and starting location "C" in die2. In FIG. 5B, the controller transmits a "read a block of size N from die0 at starting address 'A' and copy it directly to die1 and to die2" command, address, size, and destination die onto the direct channel's command/address (CA) bus in time slot X0. Because time slot 0 of each core cycle (X, Y, Z, . . . XX) is assigned to die0, die0 monitors each time slot 0 on the direct channel CA bus and receives the read block copy command, address "A", destination dies, and size of the block to be copied. At least one core cycle later, in time slot Y1, die0 drives the first unit of data read from its address "A" location (D[A]) on the direct channel's DQ bus. This is illustrated in FIG. 5B by arrow 551. While die0 is driving D[A] on the direct channel's DQ bus in the time slot associated with die1 (Y1), the controller drives a "write a block of size N starting at address 'B'" command, address, and size onto the direct channel's command/address (CA) bus in time slot Y1. This causes die1 to save the sample of the DQ bus made during time slot Y1 to receive D[A] and write it to location "B" (D[B]) of die1. This is illustrated in FIG. 5B by arrow 553.

Also at least one core cycle later, in time slot Y2, die0 drives the same first unit of data read from its address "A" location (D[A]) on the direct channel's DQ bus. This is illustrated in FIG. 5B by arrow 552. While die0 is driving D[A] on the direct channel's DQ bus in the time slot associated with die2 (Y2), the controller drives a "write a block of size N starting at address 'C'" command, address, and size onto the direct channel's command/address (CA) bus in time slot Y2. This causes die2 to save the sample of the DQ bus made during time slot Y2 to receive D[A] and write it to location "C" (D[C]) of die2. This is illustrated in FIG. 5B by arrow 554.

At least one core cycle later, in time slot Z1, die0 drives the next unit of data read from its address "A+1" location (D[A+1]) on the direct channel's DQ bus. This is illustrated in FIG. 5C by arrow 555 and the "DRV D[A+1]" in die1's row and time slot Z1. Die1 saves the sample of the DQ bus made during time slot Z1 to receive D[A+1] and write it to location "B+1" (D[B+1]) of die1. This is illustrated in FIG. 4C arrow 557 and the "SAM D[B+1]" in die1's row and time slot Z 1. Also at least one core cycle later, in time slot Z2, die0 drives the next unit of data read from its address "A+1" location (D[A+1]) on the direct channel's DQ bus. This is illustrated in FIG. 5C by arrow 556 and the "DRV D[A+1]" in die2's row and time slot Z2. Die2 saves the sample of the DQ bus made during time slot Z2 to receive D[A+1] and write it to location "C+1" (D[C+1]) of die1. This is illustrated in FIG. 5C arrow 558 and the "SAM D[C+1]" in die2's row and time slot Z2.

TABLE 3

| | | core cycle | | | | | | | | | | | | | | | |
|---|---|---|---|---|---|---|---|---|---|---|---|---|---|---|---|---|---|
| | | X | | | | Y | | | | Z | | | | XX | | | |
| | | | | | | | | slot | | | | | | | | | |
| | | X0 | X1 | X2 | X3 | Y0 | Y1 | Y2 | Y3 | Z0 | Z1 | Z2 | Z3 | XX 0 | XX 1 | XX 2 | XX 3 |
| Ctrl CA | | rbc A 1, 2 N | | | | | wbc B N | wbc C N | | | | | | | | | |
| Ctrl DQ | | | | | | | | | | | | | | | | | |

TABLE 3-continued

| | core cycle | | | | | | | | | | | | | | |
|---|---|---|---|---|---|---|---|---|---|---|---|---|---|---|---|
| | X | | | | Y | | | | Z | | | | XX | | | |
| | | | | | | | | slot | | | | | | | | |
| | X0 | X1 | X2 | X3 | Y0 | Y1 | Y2 | Y3 | Z0 | Z1 | Z2 | Z3 | XX 0 | XX 1 | XX 2 | XX 3 |
| Die0 DQ | | | | | | drv D[A] | drv D[A] | | | drv D [A + 1] | drv D [A + 1] | | | drv D [A + N − 1] | drv D [A + N − 1] | |
| Die1 DQ | | | | | | sam D[B] | | | | sam D [B + 1] | | | | sam D [B + N − 1] | | |
| Die2 DQ | | | | | | | sam D[C] | | | | sam D [C + 1] | | | | sam D [C + N − 1] | |
| Die3 DQ | | | | | | | | | | | | | | | | |

This process of driving successive data units by die0 in multiple time slots and sampling of those data units by die1 and die2 directly from the direct channels DQ bus continues until N units have been directly copied from die0 to die1 and die2. It should be understood that A may equal B, or A may not be equal to B. In addition, A may or may not equal C. B may or may not equal C. Finally, in FIGS. 5A-5C, the WBC commands to die1 and die2 are both illustrated as transferring "N" units of data. However, it is contemplated that the WBC command to die1 may specify a different number of units to be stored that the WBC command to die2.

In an embodiment, the RBC and WBC commands need only be sent once to initiate the direct block copy and to configure the destination dies to receive (and write) the copied data. In another embodiment, the RBC and WBC commands may be transmitted every core cycle. In this embodiment, the controller may scramble or rearrange the sequence data that is either read or written. For example, while data may be read in a first order (i.e., location A, A+1, A+2, etc.), it may be written in order or reverse order (i.e., location B, B+1, B+2, etc. and/or location C, C−1, C−2, etc.). In another embodiment, the RBC or WBC commands may indicate an order to the source or destination die and the memory device(s) handle the reordering of the data before it is read or written. In another embodiment, the RBC and WBC commands may indicate different strides between the addresses A, B, and C (i.e. A, A+1, A+2, etc. being copied to location B, B+10, B+20, etc. and/or location C, C+5, C+10, etc.).

FIGS. 6A-6B illustrate an example of concurrent block copies on a shared direct channel. FIGS. 6A-6B have the same rows and column definitions as FIGS. 3A-3C, 4A-4C, and 5A-5C. The contents of FIG. 6A are reproduced in Table 4.

In FIGS. 6A-6B, the controller drives a "read a block of size N from die0 at starting address 'A' and copy it directly to die2" command, address, size, and destination die onto the direct channel's command/address (CA) bus in time slot X0. This is illustrated in FIGS. 6A-6B by the "RBC A 2 N" mnemonic in the controller CA (CNTLR CA) row and X0 column. The controller also drives a "read a block of size N from die1 at starting address 'B' and copy it directly to die3" command, address, size, and destination die onto the direct channel's command/address (CA) bus in time slot X1. This is illustrated in FIGS. 6A-6B by the "RBC B 3 N" mnemonic in the controller CA (CNTLR CA) row and X1 column.

To configure die2 to receive the data for its block copy from die0, the controller drives a "write a block of size N starting at address 'C'" command, address, and size onto the direct channel's command/address (CA) bus in time slot Y2. This is illustrated in FIGS. 6A-6B by: the "WBC C N" mnemonic in the controller CA row and Y2 column. To configure die3 to receive the data for its block copy from die1, the controller drives a "write a block of size N starting at address 'B'" command, address, and size onto the direct channel's command/address (CA) bus in time slot Y3. This is illustrated in FIGS. 6A-6B by: the "WBC D N" mnemonic in the controller CA row and Y3 column.

FIG. 6B illustrates a concurrent direct block copy operation on an embodiment of a direct channel of data starting at location "A" and of size "N" from die0 of a device stack to starting location "C" in die2 and of data starting at location "B" and of size "N" from die1 of a device stack to starting location "D" in die3. In FIG. 6B, the controller transmits a "read a block of size N from die0 at starting address 'A' and copy it directly to die2" command, address, size, and destination die onto the direct channel's command/address (CA) bus in time slot X0. Because time slot 0 of each core cycle (X, Y, Z, . . . XX) is assigned to die0, die0 monitors each time slot 0 on the direct channel CA bus and receives the read block copy command, address "A", destination dies, and size of the block to be copied. At least one core cycle later, in time slot Y2, die0 drives the first unit of data read from its address "A" location (D[A]) on the direct channel's DQ bus. This is illustrated in FIG. 6B by arrow 651. While die0 is driving D[A] on the direct channel's DQ bus in the time slot associated with die2 (Y2), the controller drives a "write a block of size N starting at address 'C'" command, address, and size onto the direct channel's command/address (CA) bus in time slot Y2. This causes die2 to save the sample of the DQ bus made during time slot Y2 to receive D[A] and write it to location "B" (D[B]) of die2. This is illustrated in FIG. 6B by arrow 653.

Also at least one core cycle later, in time slot Y3, die1 drives a second unit of data read from its address "B" location (D[B]) on the direct channel's DQ bus. This is illustrated in FIG. 6B by arrow 652. While die1 is driving D[B] on the direct channel's DQ bus in the time slot associated with die3 (Y3), the controller drives a "write a block of size N starting at address 'D'" command, address, and size onto the direct channel's command/address (CA) bus in time slot Y3. This causes die3 to save the sample of the DQ bus made during time slot Y3 to receive D[B] and write it to location "D" (D[D]) of die3. This is illustrated in FIG. 6B by arrow 654.

TABLE 4

| | core cycle | | | | | | | | | | | | | | |
|---|---|---|---|---|---|---|---|---|---|---|---|---|---|---|---|
| | X | | | | Y | | | | Z | | | | XX | | | |
| | slot | | | | | | | | | | | | | | |
| | X0 | X1 | X2 | X3 | Y0 | Y1 | Y2 | Y3 | Z0 | Z1 | Z2 | Z3 | XX 0 | XX 1 | XX 2 | XX 3 |
| Ctrl CA | rbc A 2 N | rbc B 3 N | | | | | wbc C N | wbc D N | | | | | | | | |
| Ctrl DQ | | | | | | | | | | | | | | | | |
| Die0 DQ | | | | | | | drv D[A] | | | | drv D [A + 1] | | | | drv D [A + N − 1] | |
| Die1 DQ | | | | | | | | drv D[B] | | | drv D [B + 1] | | | | | drv D [B + N − 1] |
| Die2 DQ | | | | | | | sam D[C] | | | | sam D [C + 1] | | | | sam D [C + N − 1] | |
| Die3 DQ | | | | | | | | sam D[D] | | | sam D [D + 1] | | | | | sam D [D + N − 1] |

The process of driving successive data units by die0 in at least one time slot and sampling of those data units by die2 and driving successive data units by die1 in at least one time slot and sampling of those data units by die3 directly from the direct channels DQ bus continues until N units have been directly copied from die0 to die2 and N units from die1 to die3. In FIGS. 6A-6B, the RBC and WBC commands to dies0-3 are illustrated as transferring "N" units of data. However, it is contemplated that the RBC and WBC commands to respective dies0-3 may each specify different number of units.

Figure 7:
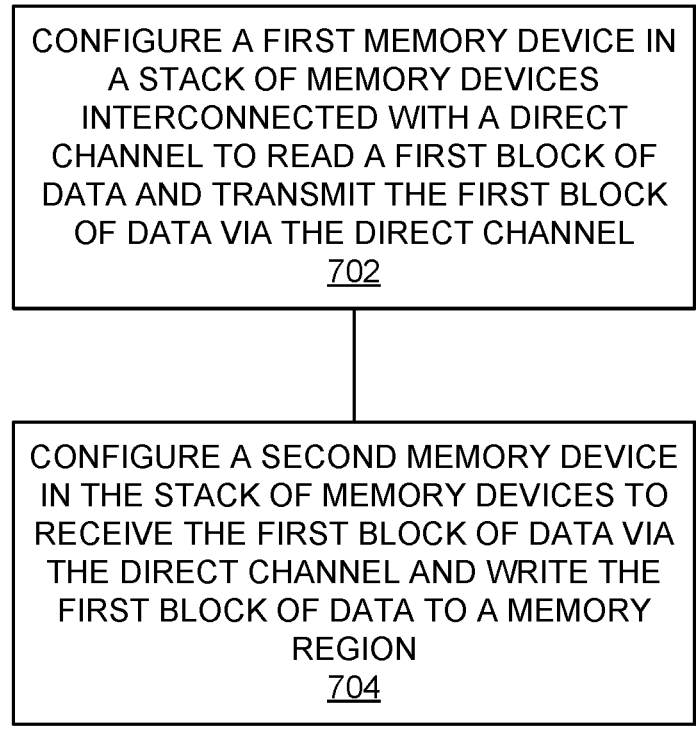
FIG. 7 is a flowchart illustrating a method of operating memory devices in a device stack.

FIG. 7 is a flowchart illustrating a method of operating memory devices in a device stack. One or more steps illustrated in FIG. 7 may be performed by, for example, system 100, assembly 200, and/or their components. A first memory device in a stack of memory devices interconnected with a direct channel is configured to read a first block of data via the direct channel (702). For example, PE/controller 111*aa* may configure, command, indicate, or instruct, via a direct channel, DRAM region 131*aa* to read a first block of data.

A second memory device in the stack of memory devices is configured to receive the first block of data via the direct channel and write the first block of data to a memory region (704). For example, PE/controller 111*a* may configure, command, indicate, or instruct, DRAM region 132*aa* to receive the first block of data and to store the first block of data in at least one memory region.

Figure 8:
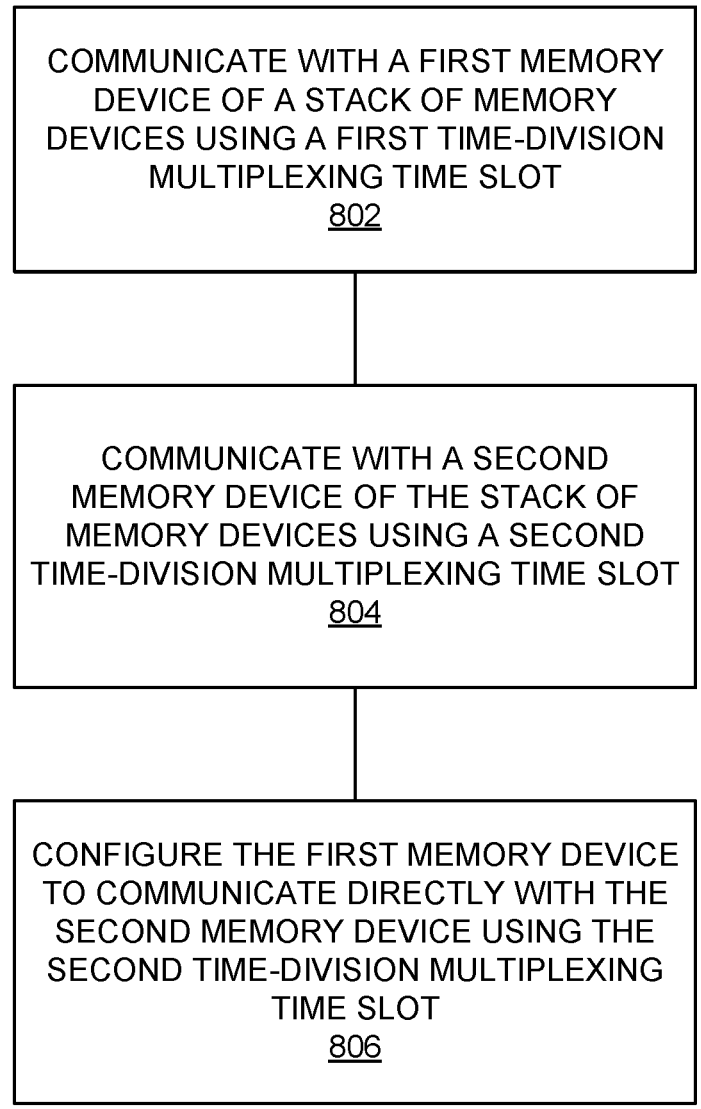
FIG. 8 is a flowchart illustrating a direct block copy among memory devices in a device stack.

FIG. 8 is a flowchart illustrating a direct block copy among memory devices in a device stack. One or more steps illustrated in FIG. 8 may be performed by, for example, system 100, assembly 200, and/or their components. A first memory device of a stack of memory devices is communicated with using a first time-division multiplexing time slot (802). For example, PE/controller 111*aa* may communicate with DRAM region 131*aa* using a first time-division multiplexing time slot (e.g., die0 time slot X0, Y0, Z0, . . . , XX0, etc. illustrated in FIGS. 3A-3C, 4A-4C, 5A-C, 6A-6B).

A second memory device of the stack of memory devices is communicated with using a second time-division multiplexing time slot (804). For example, PE/controller 111*aa* may communicate with DRAM region 132*aa* using a second time-division multiplexing time slot (e.g., die1 time slot X1, Y1, Z1, . . . , XX1, etc. illustrated in FIGS. 3A-3C, 4A-4C, 5A-C, 6A-6B).

The first memory device is configured to communicate directly with the second memory device using the second time-division multiplexing time slot (806). For example, PE/controller 111*aa* may configure, command, indicate, or instruct DRAM region 131*aa* to read data and drive the data on a common direct channel during the time slot allocated for communication between DRAM region 132*aa* and PE/controller 111*aa* (e.g., die1 time slot X1, Y1, Z1, . . . , XX1, etc. illustrated in FIGS. 3A-3C, 4A-4C, 5A-C, 6A-6B).

FIG. 9 is a flowchart illustrating a method of direct communication among memory devices in a device stack. One or more steps illustrated in FIG. 9 may be performed by, for example, system 100, assembly 200, and/or their components. A stack of memory device are configured to communicate with a controller using respective time-division multiplexing time slots where a first memory device of the stack of memory device is configured to use a first time-division multiplexing time slot and a second memory device of the stack of memory device is configured to use a second time-division multiplexing time slot (902). For example, die 131 and die 132 may be configured (e.g., by logic, by a host system, or by PE/controller 111*aa*) to assign a first time slot (e.g., die1 time slot X1, Y1, Z1, . . . , XX1, etc. illustrated in FIGS. 3A-3C, 4A-4C, 5A-C, 6A-6B) for communication between DRAM region 131*aa* and PE/controller 111*aa* and to assign a second time slot (e.g., die1 time slot X1, Y1, Z1, . . . , XX1, etc. illustrated in FIGS. 3A-3C, 4A-4C, 5A-C, 6A-6B) for communication between DRAM region 132*aa* and PE/controller 111*aa*.

The first memory device is configured to use the second time-division multiplexing time slot to communicate directly with the second memory device (904). For example, PE/controller 111*aa* may configure, command, indicate, or instruct DRAM region 131*aa* to read data and drive the data on a common direct channel during the time slot allocated for communication between DRAM region 132aa and PE/controller 111aa (e.g., die1 time slot X1, Y1, Z1, ..., XX1, etc. illustrated in FIGS. 3A-3C, 4A-4C, 5A-C, 6A-6B).

Figure 10:
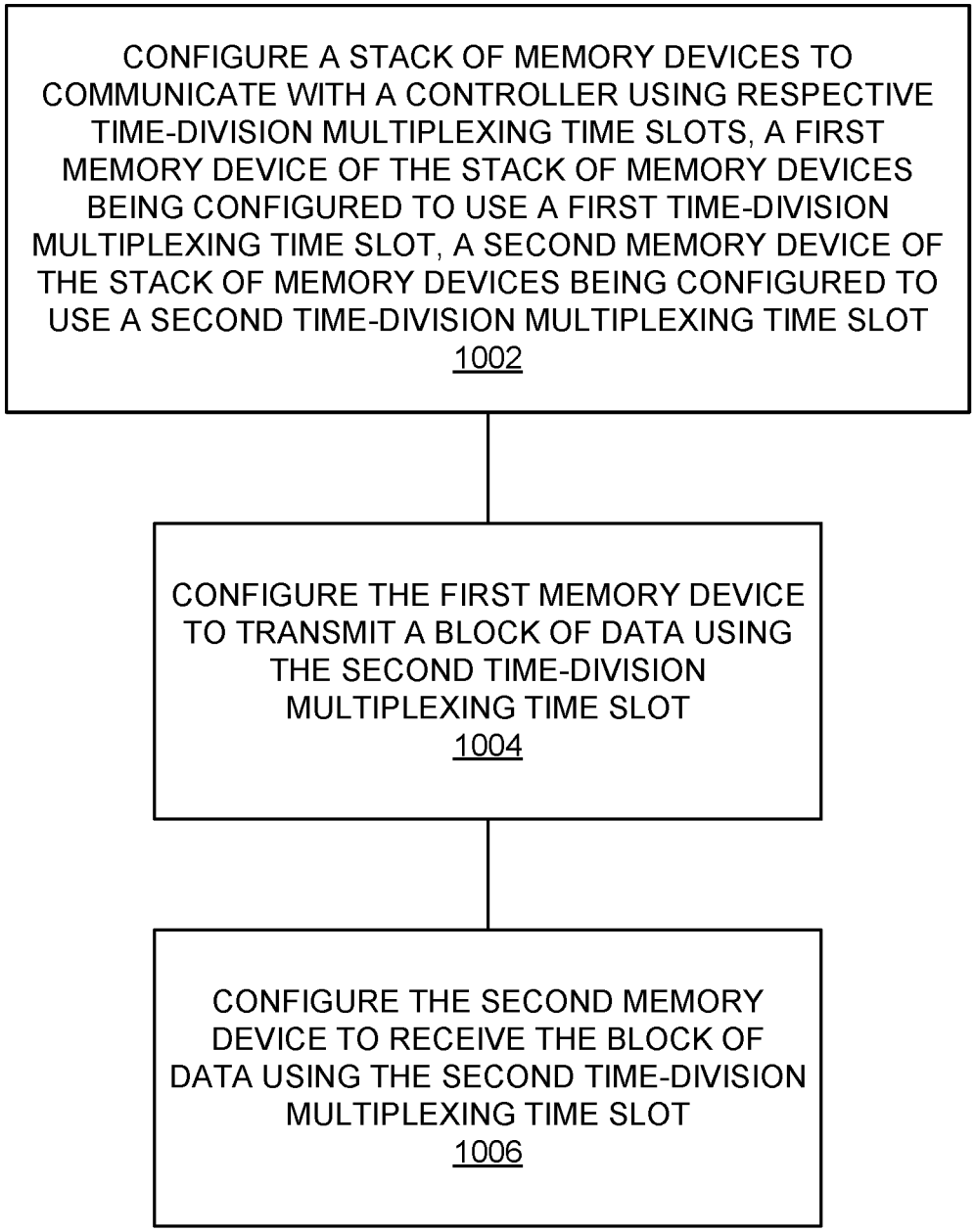
FIG. 10 is a flowchart illustrating a method of configuring memory devices in a device stack for direct communication.

FIG. 10 is a flowchart illustrating a method of configuring memory devices in a device stack for direct communication. One or more steps illustrated in FIG. 10 may be performed by, for example, system 100, assembly 200, and/or their components. A stack of memory device are configured to communicate with a controller using respective time-division multiplexing time slots where a first memory device of the stack of memory device is configured to use a first time-division multiplexing time slot and a second memory device of the stack of memory device is configured to use a second time-division multiplexing time slot (1002). For example, die 131 and die 132 may be configured (e.g., by logic, by a host system, or by PE/controller 111aa) to assign a first time slot (e.g., die1 time slot X1, Y1, Z1, ..., XX1, etc. illustrated in FIGS. 3A-3C, 4A-4C, 5A-C, 6A-6B) for communication between die 131 and die 111 and to assign a second time slot (e.g., die1 time slot X1, Y1, Z1, ..., XX1, etc. illustrated in FIGS. 3A-3C, 4A-4C, 5A-C, 6A-6B) for communication between die 132 and die 111.

The first memory device is configured to transmit a block of data using the second time-division multiplexing time slot (1004). For example, PE/controller 111aa of die 111 may configure, command, indicate, or instruct DRAM region 131aa of die 131 to read data and drive the data (e.g., using an RBC command) on a common direct channel during the time slot allocated for communication between die 132 and die 111 (e.g., die1 time slot X1, Y1, Z1, ..., XX1, etc. illustrated in FIGS. 3A-3C, 4A-4C, 5A-C, 6A-6B).

The second memory device is configured to receive the block of data using the second time-division multiplexing time slot (1006). For example, PE/controller 111aa of die 111 may configure, command, indicate, or instruct DRAM region 132aa of die 132 to store the data (e.g., using an WBC command) received on the common direct channel during the time slot allocated for communication between die 132 and die 111 (e.g., die1 time slot X1, Y1, Z1, ..., XX1, etc. illustrated in FIGS. 3A-3C, 4A-4C, 5A-C, 6A-6B).

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, assembly 200, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 11:
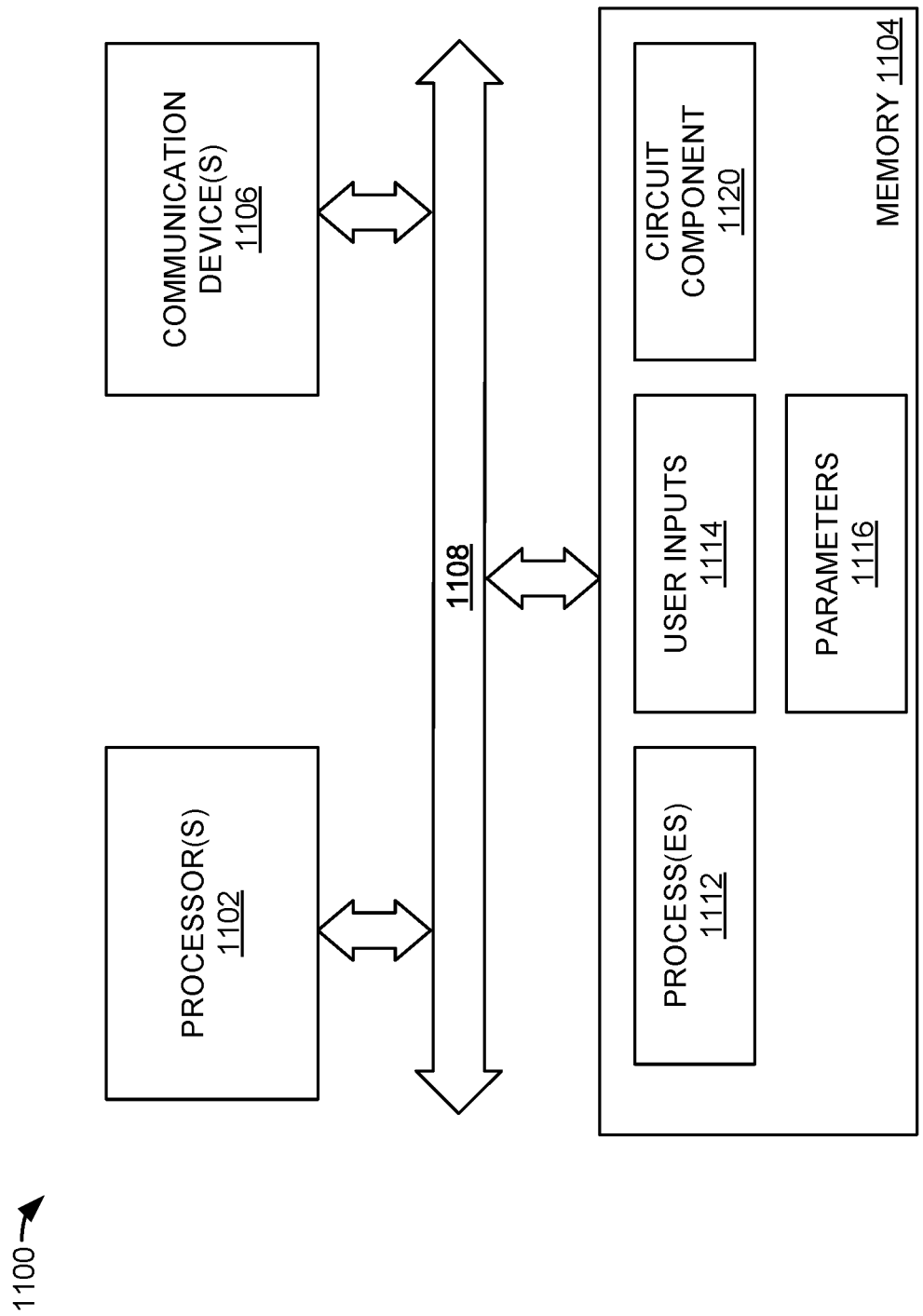
FIG. 11 is a block diagram of a processing system.

FIG. 11 is a block diagram illustrating one embodiment of a processing system 1100 for including, processing, or generating, a representation of a circuit component 1120. Processing system 1100 includes one or more processors 1102, a memory 1104, and one or more communications devices 1106. Processors 1102, memory 1104, and communications devices 1106 communicate using any suitable type, number, and/or configuration of wired and/or wireless connections 1108.

Processors 1102 execute instructions of one or more processes 1112 stored in a memory 1104 to process and/or generate circuit component 1120 responsive to user inputs 1114 and parameters 1116. Processes 1112 may be any suitable electronic design automation (EDA) tool or portion thereof used to design, simulate, analyze, and/or verify electronic circuitry and/or generate photomasks for electronic circuitry. Representation 1120 includes data that describes all or portions of system 100, assembly 200, and their components, as shown in the Figures.

Representation 1120 may include one or more of behavioral, register transfer, logic component, transistor, and layout geometry-level descriptions. Moreover, representation 1120 may be stored on storage media or communicated by carrier waves.

Data formats in which representation 1120 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1114 may comprise input parameters from a keyboard, mouse, voice recognition interface, microphone and speakers, graphical display, touch screen, or other type of user interface device. This user interface may be distributed among multiple interface devices. Parameters 1116 may include specifications and/or characteristics that are input to help define representation 1120. For example, parameters 1116 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1104 includes any suitable type, number, and/or configuration of non-transitory computer-readable storage media that stores processes 1112, user inputs 1114, parameters 1116, and circuit component 1120.

Communications devices 1106 include any suitable type, number, and/or configuration of wired and/or wireless devices that transmit information from processing system 1100 to another processing or storage system (not shown) and/or receive information from another processing or storage system (not shown). For example, communications devices 1106 may transmit circuit component 1120 to another system. Communications devices 1106 may receive processes 1112, user inputs 1114, parameters 1116, and/or circuit component 1120 and cause processes 1112, user inputs 1114, parameters 1116, and/or circuit component 1120 to be stored in memory 1104.

Implementations discussed herein include, but are not limited to, the following examples:

Example 1: A system, comprising: a device stack comprising a first set of stacked memory devices and a controller electrically coupled to, and stacked with, the first set of stacked memory devices, the first set of stacked memory devices comprising a plurality of memory cell arrays; and, intra-device stack interconnect coupling the controller, a first memory device of the first set of stacked memory devices, and a second memory device of the first set of stacked memory device to each other, the controller to configure the first memory device to read a first block of data from a first at least one memory cell array and transmit the first block of data via the intra-device stack interconnect and to configure the second memory device to receive the first block of data directly from the first memory device and to write the first block of data to a second at least one memory cell array.

Example 2: The system of example 1, wherein the first at least one memory cell array is a one of directly above and directly below the second at least one memory cell array.

Example 3: The system of example 2, wherein the first at least one memory cell array is a one of directly above and directly below the controller.

Example 4: The system of example 1, wherein the controller communicates with the first memory device and the second memory device via the intra-device stack interconnect using time-division multiplexing.

Example 5: The system of example 4, wherein the time-division multiplexing uses time allocations that are cycled at a memory cell array cycle time.

Example 6: The system of example 4, wherein the first memory device is configured to use a first time slot to transmit data to the controller and the second memory device is configured to use a second time slot to receive data from the controller, the first memory device to transmit the first block of data directly to the second memory device by transmitting the first block of data during the second time slot.

Example 7: The system of example 4, wherein the first memory device is configured to use a first time slot to receive data from the controller and the second memory device is configured to use a second time slot to receive data from the controller, the second memory device to receive the first block of data directly to the first memory device by sampling the first block of data during the second time slot.

Example 8: An integrated circuit stack, comprising: a first set of stacked memory devices that include a first memory device and a second memory device, the first set of stacked memory devices comprising memory cell circuitry; and, a first processing device electrically coupled to, and stacked with, the first set of stacked memory devices to form a first device stack, the first processing device comprising a processing element and a controller, the controller to communicate with the first set of stacked memory devices using time-division multiplexing wherein each of the first set of stacked memory devices communicates with the controller using respective ones of a set of time slots, the first memory device to communicate with the controller using a first time slot of the set of time slots, the second memory device to communicate with the controller using a second time slot of the set of time slots, the controller to configure the first memory device to communicate directly with the second memory device using the second time slot.

Example 9: The integrated circuit stack of example 8, wherein the set of time slots repeats with a duration substantially equal to a core cycle time of the first set of stacked memory devices.

Example 10: The integrated circuit stack of example 8, wherein the controller is positioned in alignment with a first memory region of the first memory device and a second memory region of the second memory device.

Example 11: The integrated circuit stack of example 10, wherein the controller, the first memory device, and the second memory device are electrically coupled using through-silicon vias.

Example 12: The integrated circuit stack of example 10, wherein communication between the controller and the first set of stacked memory devices includes commands communicated via a command/address bus and data communicated via a data bus.

Example 13: The integrated circuit stack of example 10, wherein the first set of stacked memory devices includes a third memory device, the third memory device to communicate with the controller using a third time slot of the set of time slots.

Example 14: The integrated circuit stack of example 13, wherein the controller is to configure the first memory device to communicate directly with the third memory device using the third time slot.

Example 15: The integrated circuit stack of example 14 wherein the controller is to configure the first memory device to communicate directly with the second memory device using an instance of the second time slot and to communicate with the third memory device using an instance of the third time slot that is a next successive third time slot after the second time slot.

Example 16: A controller, comprising: a command/address interface to communicate commands and addresses with a plurality of stacked memory devices via first set of shared interconnections using time-division multiplexing to separate communication between the controller and each of the plurality of stacked memory devices; and, a data interface to communicate data with the plurality of stacked memory devices via a second set of shared interconnections using time-division multiplexing to separate communication between the controller and each of the plurality of stacked memory devices.

Example 17: The controller of example 16, wherein the controller is to configure a first memory device of the plurality of stacked memory devices to transmit data in a first time slot that is assigned to a second memory device of the plurality of stacked memory devices for communication with the controller.

Example 18: The controller of example 17, wherein the controller is to configure the second memory device to receive data from the first memory device in the first time slot.

Example 19: The controller of example 16, wherein the controller is to transmit, to a first memory device of the plurality of stacked memory devices, an indicator of a first time slot that the first memory device is to transmit data, the first time slot being assigned to a second memory device of the plurality of stacked memory devices for communication with the controller.

Example 20: The controller of example 16, wherein the controller is to transmit, to a first memory device of the plurality of stacked memory devices, an indicator of a first time slot that the first memory device is to receive data from a second memory device of the plurality of stacked memory devices, the first time slot being assigned to the first memory device for communication with the controller.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system, comprising:
a device stack comprising a first set of stacked memory devices and a controller electrically coupled to, and stacked with, the first set of stacked memory devices, the first set of stacked memory devices comprising a plurality of memory cell arrays; and
intra-device stack interconnect coupling the controller, a first memory device of the first set of stacked memory devices, and a second memory device of the first set of stacked memory device to each other, the controller to configure the first memory device to read a first block of data from a first at least one memory cell array of the first memory device, and transmit the first block of data addressed to the second memory device and via the intra-device stack interconnect, the controller to configure the second memory device to receive the first block of data transmitted by the first memory device via the intra-device stack interconnect without the first block of data being re-transmitted by the controller, and the controller to also configure the second memory device to write the first block of data transmitted by the first memory device via the intra-device stack interconnect to a second at least one memory cell array of the second memory device.

2. The system of claim 1, wherein the first at least one memory cell array is a one of directly above and directly below the second at least one memory cell array.

3. The system of claim 2, wherein the first at least one memory cell array is a one of directly above and directly below the controller.

4. The system of claim 1, wherein the controller communicates with the first memory device and the second memory device via the intra-device stack interconnect using time-division multiplexing.

5. The system of claim 4, wherein the time-division multiplexing uses time allocations that are cycled at a memory cell array cycle time.

6. The system of claim 4, wherein the first memory device is configured to use a first time slot to transmit data to the controller and the second memory device is configured to use a second time slot to receive data from the controller, the first memory device to transmit the first block of data directly to the second memory device by transmitting the first block of data during the second time slot.

7. The system of claim 4, wherein the first memory device is configured to use a first time slot to receive data from the controller and the second memory device is configured to use a second time slot to receive data from the controller, the second memory device to receive the first block of data directly to the first memory device by sampling the first block of data during the second time slot.

8. An integrated circuit stack, comprising:
a first set of stacked memory devices that include a first memory device and a second memory device, the first set of stacked memory devices comprising memory cell circuitry; and
a first processing device electrically coupled to, and stacked with, the first set of stacked memory devices to form a first device stack, the first processing device comprising a processing element and a controller, the controller to communicate data with the first set of stacked memory devices using time-division multiplexing wherein respective ones of the first set of stacked memory devices communicates data with the controller using respective ones of a set of non-overlapping and periodically repeating time slots that repeat at a frequency to address communications with respective ones of the first set of stacked memory devices, the first memory device to communicate data with the controller using a first non-overlapping and periodically repeating time slot of the set of non-overlapping and periodically repeating time slots, the second memory device to communicate data with the controller using a second non-overlapping and periodically repeating time slot of the set of non-overlapping and periodically repeating time slots, the controller to configure the first memory device to transmit a block of data directly to the second memory device using at least one instance of the second non-overlapping and periodically repeating time slot without the data being re-transmitted by the controller, the controller to configure the second memory device to write the block of data transmitted by the first memory device in the at least one instance of the second non-overlapping and periodically repeating time slot to memory cell circuitry of the second memory device.

9. The integrated circuit stack of claim 8, wherein the set of non-overlapping and periodically repeating time slots repeats with a duration substantially equal to a core cycle time of the first set of stacked memory devices.

10. The integrated circuit stack of claim 8, wherein the controller is positioned in alignment with a first memory region of the first memory device and a second memory region of the second memory device.

11. The integrated circuit stack of claim 10, wherein the controller, the first memory device, and the second memory device are electrically coupled using through-silicon vias.

12. The integrated circuit stack of claim 10, wherein communication between the controller and the first set of stacked memory devices includes commands communicated via a command/address bus and data communicated via a data bus.

13. The integrated circuit stack of claim 10, wherein the first set of stacked memory devices includes a third memory device, the third memory device to communicate with the controller using a third non-overlapping and periodically repeating time slot of the set of non-overlapping and periodically repeating time slots.

14. The integrated circuit stack of claim 13, wherein the controller is to configure the first memory device to communicate directly with the third memory device using at least one instance of the third non-overlapping and periodically repeating time slot.

15. The integrated circuit stack of claim 14 wherein the controller is to configure the first memory device to communicate directly with the second memory device using a first instance of the second non-overlapping and periodically repeating time slot and to communicate with the third memory device using a first instance of the third non-overlapping and periodically repeating time slot that is a next successive third non-overlapping and periodically repeating time slot after the instance of second non-overlapping and periodically repeating time slot.

16. A controller, comprising:
- a command/address interface to communicate commands and addresses with a plurality of stacked memory devices via first set of shared interconnections using respectively assigned time-division multiplexing slots to address commands and addresses transmitted by the controller to all of the plurality of stacked memory devices, to respective ones of the plurality of stacked memory devices, each of the first set of shared interconnections being connected with each of the plurality of stacked memory devices; and
- a data interface to communicate data with the plurality of stacked memory devices via a second set of shared interconnections using time-division multiplexing that uses respective ones of a set of non-overlapping and periodically repeating time slots assigned to respective ones of the plurality of stacked memory devices to address data communication between the controller and respectively addressed ones of the plurality of stacked memory devices, each of the second set of shared interconnections being connected with each of the plurality of stacked memory devices.

17. The controller of claim 16, wherein the controller is to configure a first memory device of the plurality of stacked memory devices to transmit data in an instance of a first periodically repeating time slot that is assigned to a second memory device of the plurality of stacked memory devices for communication with the controller.

18. The controller of claim 17, wherein the controller is to configure the second memory device to receive data from the first memory device in the instance of the first periodically repeating time slot.

19. The controller of claim 16, wherein the controller is to transmit, to a first memory device of the plurality of stacked memory devices, an indicator of an instance of a first periodically repeating time slot that the first memory device is to use to transmit data, the first periodically repeating time slot being assigned to a second memory device of the plurality of stacked memory devices for communication with the controller.

20. The controller of claim 16, wherein the controller is to transmit, to a first memory device of the plurality of stacked memory devices, an indicator of an instance of a first periodically repeating time slot that the first memory device is to receive data from a second memory device of the plurality of stacked memory devices, the first periodically repeating time slot being assigned to the first memory device for communication with the controller.

* * * * *